United States Patent [19]

Wagner et al.

[11] Patent Number: 4,990,491
[45] Date of Patent: Feb. 5, 1991

[54] INSULATION FOR SUPERCONDUCTORS

[75] Inventors: George R. Wagner, Murrysville; Adolphus Patterson, Wilkinsburg, both of Pa.

[73] Assignee: Westinghouse Electric Corp., Pittsburgh, Pa.

[21] Appl. No.: 212,842

[22] Filed: Jun. 29, 1988

[51] Int. Cl.$^5$ .............................................. B32B 3/00
[52] U.S. Cl. ........................................ 505/1; 505/701; 505/702; 505/703; 505/704; 428/457; 428/688; 428/901; 428/930
[58] Field of Search ............................... 505/701–704, 505/1; 428/457, 688, 901, 930

[56] References Cited

U.S. PATENT DOCUMENTS

| | | |
|---|---|---|
| 3,408,235 | 10/1968 | Berghout et al. . |
| 3,618,205 | 11/1971 | Barber et al. . |
| 3,872,359 | 3/1975 | Feuersanger . |
| 4,053,976 | 10/1977 | Scanlan et al. . |
| 4,261,097 | 4/1981 | Weisse . |
| 4,330,347 | 3/1982 | Hirayama et al. . |
| 4,411,959 | 0/0000 | Braginski . |
| 4,419,125 | 0/0000 | Charles . |
| 4,575,927 | 0/0000 | Braginski . |
| 4,687,883 | 8/1987 | Flukiger et al. . |

FOREIGN PATENT DOCUMENTS

WO80/02619 11/1980 Japan .

OTHER PUBLICATIONS

Preparation of Y-Ba-Cu-Oro de SC Composite Tapes by a Diffusion Process, Mat. Res. Soc. Symp. Proc., vol. 99 (12/87), pp. 727–730.
Ku et al., "Superconductivity and Phase Stability in the Heavy Rare Earth Quaternary Compounds $RBa_2Cu_3O_7$ (R=Ho, Er, Tm, Yb, Lu)" in the Symposium of the MRS spring meeting, 1987.
Yoshizak et al., "Superconducting Properties of $La_{1.85}Sr_{0.15}CuO_4$ Made by Hot Press and Sintered Methods".
Christen et al., "Correlations Among Thermal Processing, Superconducting Properties and Microstructures in $La_{1.85}Sr_{0.15}CuO_4$".
Willis et al., letter to the editor entitled "Superconductivity Above 90° K. in Magnetic Rare Earth–Barium–Copper Oxides" (Journal of Magnetism and Magnetic Materials 67, 1987, North Holland, Amsterdam).
Shamoto et al., Japanese Journal of Applied Physics, Apr. 1987, "Effect of Vacuum Annealing on the Superconducting Transition Temperature of La-Sr-Cu-O System".
Uwe et al., May, 1987, Japanese Journal of Applied Physics, "Affect of Hetero-Valiant Ion Doping in the High $T_c$ Y-Ba-Cu-O Superconductor".
Kasowski et al. paper received Mar. 25, 1987 entitled "Electronic Structure of Pure and Doped Orthorombic $La_2CuO_4$".
Cooke et al., "Thermally Stimulated Luminescence from Rare Earth Doped Barium Copper Oxides".

Primary Examiner—Patrick Ryan
Attorney, Agent, or Firm—R. P. Lenart

[57] ABSTRACT

This invention is a superconductor having a generally substoichiometric oxygen, nickel oxide insulation between superconduction strands. The superconductor is to have an operating temperature below 250 degrees kelvin, and has multiple superconductors, with a cladding of nickel on the strands, and an adherent coating of nickel oxide formed on the outer surface of the cladding. The nickel oxide has stoichiometric or less than stoichiometric oxygen (but not greater than stoichiometric oxygen) to be electrically insulating at the operating temperature of the superconductor. Thus high thermal conductivity strand insulation capable of withstanding strand to strand voltages of greater than 50 volts is provided to substantially eliminate coupling currents between the strands, and nickel oxide having areas of semiconducting due to containing more than stoichiometric oxygen is avoided.

3 Claims, 1 Drawing Sheet

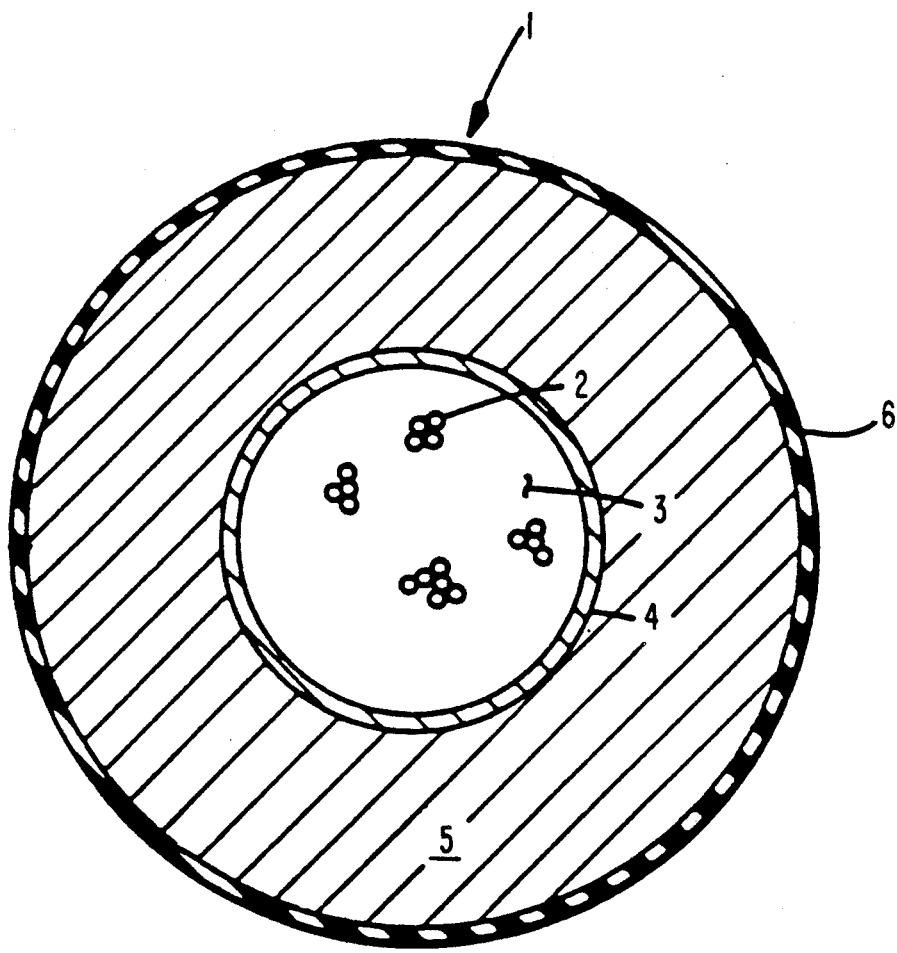

INSULATION FOR SUPERCONDUCTORS

BACKGROUND OF THE INVENTION

1. Field of the Invention

This invention relates to insulated superconductors. It is the result of a contract with the U.S. Air Force.

CROSS-REFERENCE TO RELATED APPLICATIONS

Copending application Ser. No. 217,514, filed July 11, 1988, teaches a process for making ceramic superconductors utilizing dissolved salts of metallic constituents to produce a solution which is absorbed in a preformed or formable carbonaceous material. After drying the carbonaceous material is burned away, oxidizing the metallic constituents to produce a very homogeneous ceramic superconductor which retains the form of the carbonaceous material.

Copending application Ser. No. 149,233, filed Jan. 27, 1988, teaches fabrication of ceramic superconductor containing barium or strontium or both, generally by dispersing very fine droplets of nitrate solution in a gas stream followed by a flash decomposition and oxidizing of the nitrates to produce a submicron powder or a film.

Copending application Ser. No. 154,393, filed Feb. 10, 1988, teaches fabrication of superconducting ceramic films utilizing chemical vapor deposition from chelate sources. Deposition can be on various substrates, including single-crystal and oriented-crystal.

Copending application Ser. No. 121,013, filed Nov. 16, 1987, teaches the suspension of single-crystal grains of superconductive oxide in an alkoxide gel, where the alkoxide gel contains non-oxygen constituents of the superconductor, aligning the single crystal grains of oxide superconductor, and curing the gel in an oxidizing atmosphere to form an essentially single-crystal ceramic superconductor.

Related application Ser. No. 121,016, filed Nov. 16, 1987, teaches fluidized bed chlorination of a lanthanide ore, a separation of a chloride of the rare earth superconducting component from other rare earth chlorides, reacting the rare earth superconducting component chloride to produce the alkoxide and mixing with alkoxides of other non-oxygen constituents of the superconductor to produce an alkoxide composite for processing into a superconductor.

Copending application Ser. No. 121,010 filed Nov. 16, 1987, teaches making single-crystal superconductive oxide from an alkoxide gel, where the alkoxide gel contains non-oxygen constituents of the superconductor, contacting the gel with a single crystal substrate, and curing the gel starting at the gel substrate interface to form an essentially single-crystal ceramic superconductor.

The preceding applications are all assigned to the same assignee and are all hereby incorporated by reference.

2. Description of Related Art

The recent discovery by Muller and Bednorz of ceramic superconductors which are superconductive at relatively high temperatures (e.g. now 90° K. or above) has dramatically increased the interest in superconductivity and resulted in a large number of publications. In addition, interest continues in the previous metallic superconductors such as niobium-tin or niobium-titanium.

The ceramic superconductors have generally been oxides of at least one rare earth (hereafter the term "rare earth" will be understood to include yttrium as well as the lanthanide elements, unless otherwise stated), at least one alkaline earth metal, and copper, although recently barium (or thallium), calcium, strontium, copper, oxide superconductors have been developed. Typically, the superconductors have been prepared by milling a rare earth oxide with copper oxide and with an alkaline earth metal carbonate (e.g. yttrium oxide, copper oxide, and barium carbonate) and firing the mixture at 1000°-1100° C., (typically regrinding, refiring, etc. a number of times) and then annealing the ceramic in an oxygen atmosphere at 400°-900° C. for an extended period of time (e.g. 0.5-5 days).

Ku et al. in a Paper entitled "Superconductivity and Phase Stability in the Heavy Rare Earth Quaternary Compounds $RBa_2Cu_3O_7$ (R=Ho, Er, Tm, Yb, Lu)" in the Symposium of the MRS spring meeting, 1987, discussed superconductivity in the lanthanum-barium-copper oxide system. Their samples were also produced by traditional ceramic processing, that is the oxides of the individual metals were mixed, milled, pressed, sintered, ground, repressed and annealed.

Yoshizaki et al. in a paper entitled "Superconducting Properties of $La_{1.85}Sr_{0.15}CuO_4$ Made by Hot Press and Sintered Methods" investigated superconducting transition properties by resistivity and magnetization in lanthanum-strontium-copper oxide for hot pressed and sintered samples. A single crystal was obtained in a portion of one sample.

Christen et al. in a paper entitled "Correlations Among Thermal Processing, Superconducting Properties and Microstructure in $La_{1.85}Sr_{0.15}CuO_4$" synthesized materials beginning with co-precipitation of lanthanum oxide, strontium oxide, and copper oxide from solution in molten urea followed by cold pressing into pellets, sintering/reacting at 1100° C. for four hours in air and annealing in flowing oxygen at 900° C. for 16 hours.

Willis et al. in a letter to the editor entitled "Superconductivity Above 90° K. in Magnetic Rare Earth-Barium-Copper Oxides" (Journal of Magnetism and Magnetic Materials 67, 1987, North Holland, Amsterdam) report measurements of superconducting and magnetic behavior on samples which were prepared by sintering the rare earth oxide, copper oxide, and barium carbonate in an oxygen atmosphere at 1000° C., regrinding and resintering at least twice more to promote reaction and obtain the desired phase.

Shamoto et al. in the Japanese Journal of Applied Physics, April, 1987, article entitled "Effect of Vacuum Annealing on the Superconducting Transition Temperature of La-Sr-Cu-O System" report the effect of vacuum annealing on the superconducting transition temperature of the superconductor lanthanum-strontium-copper oxide system. Their starting materials were apparently mixes of individual oxides, pressed and sintered at about 1100° C.

Uwe et al. in the May, 1987 Japanese Journal of Applied Physics paper entitled "Affect of Hetero-Valiant Ion Doping in the High $T_C$ Y-Ba-Cu-O Superconductor" discussed the effect of cerium or lanthanum doping on the resistive transition of high $T_C$ superconductors (i.e. yttrium-barium-copper oxide). The samples were subjected to a procedure in which the material was pulverized, pressed and fired at 850°-1000° C. for 2-10 hours in air or oxygen, with the procedure performed two or three times. Some of the samples were then annealed in oxygen at 700° C. for two or three hours. Their doping did not improve the properties and they saw some degradation.

Kasowski et al. in a paper received Mar. 25, 1987 entitled "Electronic Structure of Pure and Doped Orthorombic La$_2$CuO$_4$" investigate the electronic structure of orthorombic lanthanum-copper oxide and discuss the implications for superconductivity.

Cooke et al. in a paper entitled "Thermally Stimulated Luminescence from Rare Earth Doped Barium Copper Oxides" discuss luminescence and emission spectrum measurements of rare-earth-doped barium-copper oxides. The loss of luminescence sensitivity with time, especially when the samples were maintained in vacuum, and the propensity of oxygen-defect perovskites to readily lose or gain oxygen were noted. It was suggested that these measurements might present a very sensitive way to investigate the problem of oxygen stability in these materials.

Braginski et al., in U.S. Pat. Nos. 4,411,959 and 4,575,927 issued Oct. 25, 1983 and Mar. 18, 1986, respectively, teach a submicron particle superconductor arrangement in which brittle superconductive particles remain unsintered in the fabricated wire, thus give a ductile wire, even though the superconducting material is brittle. The small particles provide spacing between particles of much less than the Ginzburg-Landau coherence lengths to avoid any significant degradation to $T_c$. U.S. Pat. No. 4,419,125 to Charles et al. on Dec. 6, 1983 teaches using liquid alkali metal to co-reduce a mixture of solid halides to produce such submicron powders.

The Weisse U.S. Pat. No. 4,261,097, relates to a method for insulating superconductors in a magnet winding. The method includes the steps of: (a) winding intermediate conductor products along with insulators and binders; (b) treating insulators to remove binders; (c) annealing to form superconductors; and (d) completely removing binders (see claim 1). Insulating Nb$_3$Sn superconducting magnet windings are disclosed; however, nickel oxide is not mentioned as an insulating material.

The Scanlan et al. U.S. Pat. No. 4,053,976, relates to a method of making a Nb$_3$Sn wire. The method includes forming a niobium-copper composite wire which is niobium in the form of a filament in a copper matrix, coating the wire with tin, heating the coated wire, depositing a layer of nickel or copper onto the wire and diffusing the tin into the wire to form Nb$_3$Sn wire.

The published PCT Application, No. WO 80/02619, relates to a superconductor used as a coil for a magnet with a nickel oxide coating.

The Berghout et al., U.S. Pat. No. 3,408,235, and the Barber et al., U.S. Pat. No. 3,618,205 relate to Nb$_3$Sn filaments containing an oxide film. These patents do not disclose the use of nickel oxide as an insulating material.

The Hirayama et al., U.S. Pat. No. 4,330,347, relates to a resistive or semiconducting coating for use on Nb$_3$Sn current conductors or hyperconductors in cryogenic applications. The coating is composed of cuprous sulfide. The layer provides enough insulation to reduce eddy current losses between strands, but enough conductivity to allow current transfer from the superconductor to copper wires in the event that the superconductor normalizes.

The Flukiger et al., U.S. Pat. No. 4,687,883, relates to a method for producing Nb$_3$Sn multifilament superconductive wires embedded in a copper or copper alloy matrix. Additive elements included in the matrix include Ti, Zr, Hf, V, Nb, Ta, Fe, Co and Ni. The patent does not disclose the use of nickel oxide as an insulating material.

The Feuersanger U.S. Pat. No. 3,872,359, relates to a thin film transistor utilizing a semiconducting layer formed of a defect-nickel oxide. Filamentary Nb$_3$Sn wires with nickel oxide coatings are not disclosed.

Multifilamentary Nb$_3$Sn superconductors usually consist of Nb$_3$Sn filaments imbedded in a bronze matrix surrounded by copper. Because Nb$_3$SN is a brittle, intermetallic compound, the conductor is usually processed to final form with Nb filaments in a copper or bronze matrix. The Nb$_3$Sn is then formed by reaction of the filaments with the Sn in the bronze or from some other internal or external source. This reaction takes place at temperatures in the range 600°–750° C. A film insulation system suitable for use on these conductors has long been sought. Conventional organic insulations, such as Formvar or Omega, cannot withstand the reaction temperature and must be applied after the Nb$_3$Sn is formed. The current carrying capacity of the superconductor is degraded by strain which may occur during the insulation process. Furthermore, subsequent winding into a magnet usually creates significant strain of the conductor and a corresponding degradation of its properties.

The desired insulation system is one that withstands the high reaction temperature so that it may be applied before the Nb$_3$Sn is formed, or one that may be applied during the reaction so that both the insulation and the Nb$_3$Sn may be formed concurrently after the wire is wound into a magnet.

Although Nb$_3$Sn superconductors are generally used in the examples and discussions herein, the ceramic superconductors are also brittle, and also generally need heating in final form (e.g. 500°–900° C. post-bake), and the invention herein applies to insulation for ceramic superconductors.

SUMMARY OF THE INVENTION

This invention is a superconductor having a generally substoichiometric oxygen, nickel oxide insulation between superconduction strands. The superconductor is to have an operating temperature below 250 degrees kelvin, and has at least two strands, each containing a superconductor, with a cladding consisting essentially of nickel disposed about at least one of the strands, and an adherent coating of nickel oxide formed on the outer surface of the cladding. The nickel oxide has stoichiometric or less than stoichiometric oxygen, but not greater than stoichiometric oxygen to be electrically insulating at the operating temperature of the superconductor. Thus high thermal conductivity strand insulation capable of withstanding strand to strand voltages of greater than 50 volts is provided to substantially eliminate coupling currents between the strands, and nickel oxide having areas of semiconducting due to containing more than stoichiometric oxygen is avoided.

Preferably the nickel oxide has 0.7–0.99 stoichiometric oxygen, with each strand having the cladding, and each having the coating of nickel oxide, with the coatings having a thickness in the range of 1.5–20.0 microns.

BRIEF DESCRIPTION OF THE DRAWING

The single FIGURE is a schematic cross-sectional view of a typical semiconductor strand for use in a standard cable for superconducting magnets.

DESCRIPTION OF THE PREFERRED EMBODIMENT

A typical superconductor wire strand used in a sheathed cable is illustrated in the single FIGURE and comprises a large number of superconductor, e.g., Nb$_3$Sn, filaments 2 imbedded in a copper-rich matrix 3, e.g., bronze. The matrix 3 (core) is shown surrounded by a thin tantalum sheath 4 and outside the sheath 4 is a layer 5 of high-conductivity copper. Before the strand 1 of the FIGURE and others like it may be compacted into a stainless steel jacket to form the stranded cable, each of the individual strands must have an electrically resistive layer on its surface to reduce the coupling of currents between strands in the finally assembled cable.

It has been discovered that a film of generally substoichiometric oxygen, nickel oxide (NiO) 6 applied to the outer surface of each strand is an ideal outer layer for the strand. Since the nickel oxide is preferably not be stoichiometric, a more proper designation would be NiO$_{1-x}$, where X<0.3; however, for convenience hereinafter; the terms "nickel oxide" or "nickel suboxide" will be used in this specification. Such a film is insulative at cryogenic temperatures, has excellent adhesion to nickel which in turn has excellent adhesion to copper and does not chip or spall when the strand is bent over a radius subjecting it to a strain of the order of 2% or less. Also, the nickel oxide is stable in an inert atmosphere at 700° C. and does not degrade the electrical properties of the nickel and copper to which it is attached when subjected to 700° C. for at least 30 hours.

It should also be noted that NiO films and suboxide films are insulative, but films having excess oxygen are semiconductive. By using generally substoichiometric oxygen, semiconductive portions due to process variations are avoided.

The insulation suggested in this invention is composed of a thin layer of nickel oxide formed on the surface of the superconductor wire. The oxide is formed by reaction of a thin nickel layer, e.g., previously plated on the wire, in an atmosphere containing a partial pressure of oxygen. The reaction can take place at temperatures in the range which are used to form the Nb$_3$Sn.

The experiments carried out so far consisted of firing Ni plated copper wire in an atmosphere of nitrogen containing 500–1000 ppm oxygen. At 700° C. a black suboxide of nickel is formed, NiO$_{1-x}$, which is very adherent and provides voltage breakdown strengths in the range of 50–100 volts. Single strands of wire were reacted and then twisted to measure breakdown strengths. A small solenoidal coil consisting of ten layers of approximately 100 turns each was also reacted. The oxide was formed throughout the coil, but not uniformly.

The nickel oxide layer formed is preferably a suboxide containing oxygen vacancies. It will serve as an insulator at the cryogenic operating temperature of Nb$_3$Sn. Cuprous sulfide is a semiconductor which has been patented for use on superconductors. (See the aforementioned U.S. Pat. No. 4,330,347 of C. Hirayama and G. R. Wagner.) However, cuprous sulfide breaks down at approximately 0.5 volts while the nickel oxide will provide a higher voltage stand-off, in the range 50 to 100 volts.

A further advantage of the nickel oxide as an insulation system over conventional organics or inorganics is that it provides better thermal contact between the superconductor and its coolant. Good thermal contact is required to stabilize the superconductor during magnetic and electrical disturbances. The thinness of the oxide layer provides a low thermal barrier for heat transfer from the superconductor to its surroundings.

The results obtained are not dependent upon the matrix of the superconductor wire. In practice, this matrix may be any copper-rich alloy such as Cu-Ni or Cu-Sn. As stated above, there is a temperature limit to prevent damage to the superconductor material. The cited specific conditions provided a very tough nickel oxide coating thickness. By varying the gas flow, the wire speed through the furnace, and the furnace temperature, a suitable thickness of about 1.5 $\mu$m to about 20 $\mu$m may be obtained. A thickness of less than about 1.5 $\mu$m may not provide a sufficiently resistive layer, and thicknesses above about 20 $\mu$m tend to spall from the surface upon severe bending of the wire. Temperatures for coating may be as low as room temperature; however, long coating times are required unless the temperature is above about 200° C.

In addition there are uses of nickel oxide coatings for applications other than for superconducting cables, and components thereof. For instance, it could be applied to the recently developed "hyperconductors" which are normal conductors with very high electrical conductivity at low temperatures.

The foregoing description of a preferred embodiment of the invention, i.e., as applied to superconductor wires, has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments as are suited to the particular use contemplated. It is intended that the scope of the invention be defined by the claims appended hereto.

We claim:
1. A superconducting cable comprising:
    at least two wire strands, each consisting of a superconductor having an operating temperature below 250 degrees Kelvin;
    a cladding consisting essentially of nickel disposed about at least one of said strands; and
    an adherent coating of 1.5–20.0 micron thickness of nickel oxide formed on the outer surface of said cladding, said nickel oxide having 0.7 to 0.99 stoichiometric oxygen, to be electrically insulating at the operating temperature of said superconductor, whereby high thermal conductivity strand insulation capable of withstanding strand to strand voltages of greater than 50 volts is provided to substantially eliminate coupling currents between the strands, and whereby nickel oxide having areas thereof semiconducting due to containing more than stoichiometric oxygen is avoided.
2. The cable of claim 1, wherein multiple strands are used, each strand having said cladding, and each having said coating of nickel oxide.
3. A superconducting cable comprising:
    at least two wire strands, each consisting of a superconductor having an operating temperature below 250 degrees Kelvin;
    a cladding consisting essentially of nickel disposed about said strands; and
    an adherent coating of 1.5–20.0 micron thickness of nickel oxide formed on the outer surface of said cladding, said nickel oxide having 0.7 to 0.99 stoichiometric oxygen to be electrically insulating at the operating temperature of said superconductor, whereby high thermal conductivity strand insulation capable of withstanding strand to strand voltages of greater than 50 volts is provided to substantially eliminate coupling currents between the strands and whereby nickel oxide having areas thereof containing more than stoichiometric oxygen due to production variations is substantially avoided.

* * * * *